(12) United States Patent
Koyama et al.

(10) Patent No.: US 7,205,618 B2
(45) Date of Patent: Apr. 17, 2007

(54) SEMICONDUCTOR DEVICE AND METHOD FOR MANUFACTURING THE SAME

(75) Inventors: Masato Koyama, Kanagawa (JP); Akira Nishiyama, Kanagawa (JP); Yuuichi Kamimuta, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 11/052,036

(22) Filed: Feb. 8, 2005

(65) Prior Publication Data

US 2005/0184346 A1     Aug. 25, 2005

(30) Foreign Application Priority Data

Feb. 19, 2004   (JP) .............................. 2004-042560

(51) Int. Cl.
   H01L 27/01   (2006.01)
   H01L 27/12   (2006.01)
   H01L 31/0392 (2006.01)
   H01L 31/119  (2006.01)
   H01L 31/113  (2006.01)

(52) U.S. Cl. ................... 257/386; 257/351; 257/369

(58) Field of Classification Search ........ 257/350–351, 257/368–379, 382–412
   See application file for complete search history.

(56) References Cited

U.S. PATENT DOCUMENTS 6,909,145 B2 *  6/2005  Cabral et al. ............... 257/336
6,977,415 B2 * 12/2005  Matsuo ........................ 257/330
7,135,724 B2 * 11/2006  Chen et al. .................. 257/288

FOREIGN PATENT DOCUMENTS

JP    11-297991    10/1999

* cited by examiner

Primary Examiner—Cuong Nguyen
(74) Attorney, Agent, or Firm—Oblon, Spivak, McClelland, Maier & Neustadt, P.C.

(57) ABSTRACT

A semiconductor device includes a silicon substrate, a channel region formed in a surface of the silicon substrate, a gate insulating film formed on the channel region, a gate electrode formed on the gate insulating film, first gate side walls formed on the gate insulating film to sandwich the gate electrode in a gate length direction, second gate side walls which sandwich the gate electrode and the first gate side wall, first diffused layers formed on the surface of the silicon substrate to sandwich the channel region, second diffused layers which sandwich the channel region and the first diffused layer and have a larger depth than that of the first diffused layer, and low resistance layers which are formed between the first diffused layer and the second gate side wall and contain nitride, boride or carbide of Ti, Zr, Hf or Ta.

13 Claims, 7 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2004-042560, filed on Feb. 19, 2004; the entire contents of which are incorporated herein by reference.

BACKGROUND OF THE INVENTION

1. Field of the Invention

This invention relates to a semiconductor device equipped with a field effect transistor and a method for manufacturing the same.

2. Description of the Related Art

In a MOSFET (Metal-Oxide-Semiconductor-Field Effect Transistor) belonging to a generation of 0.1 µm (gate length), it is estimated that signal delay due to parasitic resistance residing between a wiring portion and a channel region of the MOSFET, i.e. in first diffused layers formed to sandwich the channel region and second diffused layers more deeply formed to sandwich the first diffused layers will be serious.

The parasitic resistance mainly includes contact resistance, silicide resistance and extension resistance. Of these resistances, the extension resistance is attributable to the first diffused layer.

The first supposed method for reducing the extension resistance is to extend a resistance sectional area downward, i.e. to increase the thickness of the first diffused layer. The second supposed method is to shorten the resistance length, or shorten the length of the first diffused layer in a gate length direction. In the first and second methods, however, a diffused layer forming a source and another diffused layer forming a drain become near to each other so that a problem of the short channel effect of MOSFET becomes evident.

A third supposed method is to increase the impurity concentration of the first diffused layer extremely. However, the impurity concentration of impurities soluble in silicon has an upper limit. For this reason, it is difficult to improve the impurity concentration extremely from the present impurity concentration. Accordingly, there is little hope in the reduction in the extension resistance by this technique.

Thus, it was difficult to reduce the extension resistance effectively without making manifest the other problem such as the short-channel effect.

In view of this, as a fourth method, it was proposed to provide a conductive layer (hereinafter referred to as "low resistance layer") formed between the upper surface of a first diffused layer and the lower surface of a gate side wall so as to sandwich a gate insulating film (see JP11-297991(kokai)). This method was considered to realize to reduce the extension resistance without making manifest the problem of the short channel effect.

However, the above fourth method presented a problem in consistency with an existing or present manufacturing method.

In the present manufacturing method, after the step of forming the low resistance layer, the step of high-temperature heat treatment is carried out. For example, as the step of forming the second diffused layer, the high temperature heat treatment at about 1000° C. is carried out.

On the other hand, in the fourth method, silicide of refractory metal such as Ti, Co, Pt, etc. is adopted for the low resistance layer. This low resistance layer, however, cannot have heat resistance. This made it difficult to manufacture semiconductor devices. The reason therefor is as follows. Since the silicide of the refractory metal has a melting point of about 2200° C. (about 2470 K) or lower, at an absolute temperature about 0.5 times or more as high as this melting point, i.e. at the temperature of about 960° C. (about 1230 K) or higher, atom diffusion in the silicide of the metal becomes active, thereby generating agglomeration or decomposition of the low resistance layer.

Further, generally, the silicide of the refractory metal, after metal has been deposited on the surface of the silicon substrate, is formed so that the metal consumes the silicon by heat treatment. However, it is difficult to control the consumption of the silicon by the metal so that the low resistance layer is likely to be formed to penetrate the first diffused layer. This will break a pn junction, thereby giving rise to a problem of the short-circuiting of MOSFET. This problem, in the present technique, is particularly manifest in the MOSFET from the generation of 0.1 µm (gate length) onward.

SUMMARY OF THE INVENTION

This invention has been accomplished in view of the above circumstance. This invention intends to provide a semiconductor device which has high heat resistance, provides excellent consistency with an existing manufacturing method and has a reduced extension resistance. Further, this invention also intends to provide a simple method for manufacturing such a semiconductor device.

According to an aspect of the present invention, a semiconductor device includes a silicon substrate, a channel region formed in a surface of the silicon substrate, a gate insulating film formed on the channel region, a gate electrode formed on the gate insulating film, first gate side walls formed on the gate insulating film to sandwich the gate electrode in a gate length direction, second gate side walls which sandwich the gate electrode and the first gate side wall, first diffused layers formed on the surface of the silicon substrate to sandwich the channel region, second diffused layers which sandwich the channel region and the first diffused layer and have a larger depth than that of the first diffused layer, and low resistance layers which are formed between the first diffused layer and the second gate side wall and contain nitride, boride or carbide of Ti, Zr, Hf or Ta.

According to another aspect of the present invention, a complementary semiconductor device includes a silicon substrate, a p-type semiconductor field-effect transistor, and an n-type semiconductor field-effect transistor. Preferably, the p-type semiconductor field-effect transistor includes an n-type channel region formed in a surface of the silicon substrate, a first gate insulating film formed on the n-type channel region, a first gate electrode formed on the first gate insulating film, first gate side walls formed on the first gate insulating film to sandwich the first gate electrode in a gate length direction, second gate side walls which sandwich the first gate electrode and the first gate side wall, first p-type diffused layers formed on the surface of the silicon substrate to sandwich the n-type channel region, second p-type diffused layers which sandwich the n-type channel region and the first p-type diffused layer and have a larger depth than that of the first p-type diffused layer, and p-type corresponding low resistance layers which are formed between the first-type diffused layer and the second gate side wall and contain boride of Ti. Preferably, the n-type semiconductor field-effect transistor includes a p-type channel region formed in the surface of the silicon substrate, a second gate insulating film formed on the p-type channel region, a second gate electrode formed on the second gate insulating film, third gate sidewalls formed on the second gate insulating film to sandwich the second gate electrode in a gate length direction, fourth gate side walls which sandwich the second gate electrode and the third gate side wall, first n-type diffused layers formed on the surface of the silicon substrate to sandwich the p-type channel region, second n-type diffused layers which sandwich the p-type channel region and the first n-type diffused layer and have a larger depth than that of the first n-type diffused layer, and n-type corresponding low resistance layers which are formed between the first n-type diffused layer and the fourth gate side wall and contain carbide of Ti, Zr, Hf or Ta, nitride of Zr, or boride of Hf or Zr.

According to yet another aspect of the present invention, a method for manufacturing a semiconductor device including forming a gate insulating film containing oxide of Ti, Zr, Hf or Ta on a silicon substrate, forming a gate electrode on the gate insulating film, forming first diffused layers on a surface of the silicon substrate which sandwich the gate electrode, forming first gate side walls on the gate insulating film which sandwich the gate electrode in a gate length direction, converting a part of the gate insulating film which is not covered with the gate electrode and the first gate side wall into a low resistance precursor layer by supplying nitrogen, boron or carbon, converting the low resistance precursor layer into a low resistance layer by forming a mixture of nitride, boride or carbide of Ti, Zr, Hf or Ta and oxide of Ti, Zr, Hf or Ta by heat treatment, forming second gate side walls which sandwich the gate electrode and the first gate side wall, and forming second diffused layers in the silicon substrate which sandwich the gate electrode, the first gate side wall and the second gate side wall.

In accordance with this invention, there is provided a semiconductor device which has high heat resistance, provides excellent consistency with an existing manufacturing method and has a reduced extension resistance.

Further, in accordance with this invention, there is provided a simple method for manufacturing a semiconductor device capable of reducing the extension resistance.

DETAILED DESCRIPTION OF THE INVENTION

Now referring to the drawings, an explanation will be given of various embodiments of this invention. Incidentally, with like reference symbols referring to like configurations in all the embodiments, repetition of the explanation will be avoided. Further, each figure is a schematic view for explanation and understanding of the invention. The shape, size, ratio, etc. in an illustrated device are different at some portions from those in an actual device. They, however, can be modified or changed as required referring to the following description and known techniques.

Incidentally, in each of the various embodiments, although an explanation will be made for the MOSFET using an oxide as a gate insulating film, the gate insulating film should not be limited to the oxide. Each embodiment can be likewise applied to the MOSFET using other insulating materials such as a nitride, fluoride, etc.

Embodiment 1

Figure 1A:
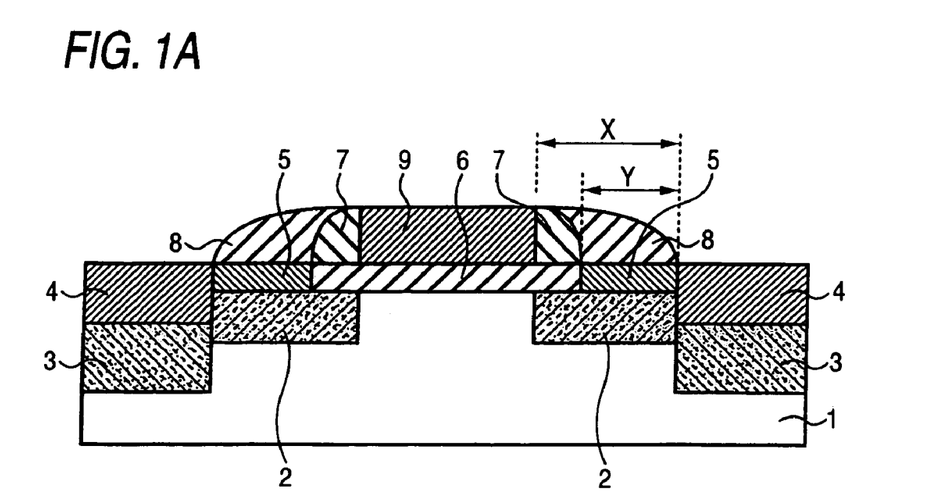
FIG. 1A is a sectional schematic view showing the MOSFET according to a first embodiment of this invention.

Referring to FIG. 1A, an explanation will be given of the MOSFET according to the first embodiment.

FIG. 1A is a sectional schematic view in a gate length direction of the MOSFET according to the first embodiment.

As seen from FIG. 1A, a channel region sandwiched between first diffused layers 2 is formed on the central surface of a silicon substrate 1. Second diffused layers 3 having a larger depth than that of the first diffused layers 2 are formed in the silicon substrate 1 so as to sandwich the channel region and the first diffused layers 2. Contact electrodes 4 are formed on the silicon substrate 1 surface on the second diffused layers 3 so as to sandwich the channel region and first diffused layers 2. A gate insulating film 6 is formed to cover the channel region and extend over the first diffused layers 2. A gate electrode 9 and first gate side walls 7 are located on the gate insulating film 6. The gate electrode 9 is formed to be sandwiched between the first gate side walls 7. The channel region is located immediately beneath the gate electrode 9 via the gate insulating film 6. Second gate side walls 8 are formed to sandwich the gate electrode 9 and first gate side walls 7. Each of low resistance layers 5 is formed to be located between the upper surface of the first diffused layer 2 and the lower surface of the second gate side wall 8 and to be adjacent to the gate insulating film 6. Contact electrodes 4 are formed on the second diffused layers 3, respectively.

The low resistance layer 5 is characterized by containing an nitride, boride or carbide of Ti, Zr, Hf or Ta. The low resistance layer 5 is so conductive as to reduce the extension resistance.

As indicated in Table 1, the nitride, boride or carbide of Ti, Zr, Hf or Ta has a melting point of about 3000° C. (about 3270 K) or higher. The agglomeration or decomposition of the low resistance layer 5 occurs at the absolute temperature about 0.5 times or more as high as this melting point, i.e. at the temperature of about 1360° C. (about 1630 K) or higher. For this reason, the low resistance layer 5 according to this embodiment, which has heat resistance of about 1000° C., will not be deteriorated during the step of forming the second diffused layers 3 subjected to the heat treatment of about 1000° C. This verifies excellent consistency with the existing manufacturing method.

TABLE 1

|  | Metal | Melting Point (° C.) | Resistivity (μΩ · cm) |
|---|---|---|---|
| Nitride | Ti | 2980 | 21.7 |
|  | Zr | 2930 | 13.6 |
|  | Hf | 3310 | 33 |
|  | Ta | 3090 | 135 |
| Boride | Ti | 2980 | 28.4 |
|  | Zr | 3040 | 9.2 |
|  | Hf | 3100 | 10 |
|  | Ta | 3000 | 100 |
| Carbide | Ti | 3160 | 180 |
|  | Zr | 3030 | 70 |
|  | Hf | 3890 | 109 |
|  | Ta | 3880 | 30 |
| Silicide | Co | 1460 | 68 |
|  | Pt | 1229 | 35 |
|  | Ti | 1540 | 123 |
|  | Zr | 1700 | 100 |
|  | Hf | 1800 | 62 |
|  | Ta | 2200 | 38 |

Of the compounds described in Table 1, preferable compounds are the nitride or boride of Ti, Zr or Hf or carbide of Ta.

As seen from Table 1, these compounds have a low resistivity as compared with the silicide of Co, Pt, Ti, Zr, Hf and Ta. These compounds, therefore, can further reduce the extension resistance.

The gate insulating film 6 may be a silicon oxide film, a highly-dielectric insulating film (insulating material having a higher dielectric constant than the silicon oxide film), or a mixture thereof. The highly-dielectric insulating film may be made of e.g. a metal silicate or metal aluminate of Hf. Zr, La, etc, or that supplied with nitrogen. Otherwise, the highly-dielectric insulating film may be made of $Si_3N_4$, $Al_2O_3$, $Ta_2O_5$, $La_2O_5$, $CeO_2$, $ZrO_2$, $HfO_2$, $SrTiO_3$, $Pr_2O_3$, etc The gate electrode 9 may be made of a semiconductor compound of poly-Si, SiGe, etc., refractory metal, refractory metallic compound, etc.

The first gate side wall 7 maybe made of an insulating material such as $SiO_2$. The $SiO_2$ is preferred because it can electrically stabilize the side of the gate electrode/gate insulating film stacking structure.

The second gate side wall 8 may be made of an insulating material such as SiN. The SiN is preferred because it has an effect of suppressing the diffusion of impurities into the gate stacking structure during subsequent steps.

The contact electrode 4 may be made of metal, metal silicate, etc.

Incidentally, as seen from FIG. 1, reference symbol X denotes the width in a gate length direction of the first gate side wall 7 plus the second gate side wall 8. Reference symbol Y denotes the width in a gate length direction of the low resistance layer 5.

The preferable value of Y/X differs for the respective generations. With advance of the generation, the value of Y/X becomes small. For example, in the generation of 45 nm, the value of Y/X preferably ranges from 0.25 (inclusive) to 0.50 (inclusive). The value of Y/X being 0.25 or more serves to assure the width in a gate length direction of the low resistance layer and sufficiently achieve the effect of reducing the extension resistance. The value of Y/X being 0.50 or less serves to suppress the electric short-circuiting between the low resistance layer 5 and the gate electrode 9.

Further, where the first gate side wall is made of $SiO_2$ and the gate insulating film 6 is made of SiN, if the value of X−Y (the horizontal width of the first gate side wall 7) is 10 nm or more, it is possible to suppress the diffusion of metallic atoms from the low resistance layer 5.

Two modifications of the first embodiment will be explained below.

Modification 1 and Modification 2 are directed to MOSFET manufactured using the manufacturing method according to this invention.

First, the first modification will be explained.

In the manufacturing method according to the third embodiment of this invention, by converting a part of the gate insulating film 6 made of the oxide of Ti, Zr, Hf or Ta into a nitride, boride or carbide, the low resistance layers 5 are formed. This is carried out on the basis of the fact that the metal of Ti, Zr, Hf and Ta exhibits a conducting performance in its nitride, boride or carbide, and exhibits an insulating performance in its oxide.

The low resistance layer 5, therefore, is made of a mixture of the nitride, boride or carbide of Ti, Zr, Hf or Ta and the oxide thereof. The gate insulating film 6 is made of the oxide of Ti, Zr, Hf or Ta. The low resistance layer 5 and gate insulating film 6 have equal molar concentrations of each atom of Ti, Zr, Hf or Ta.

Incidentally, as regards this equality of the molar concentration, it is assumed that the molar concentration varies within an allowable margin of error owing to the influence from the heat treatment step in the manufacturing process, the thickness of the low resistance layer 5 and gate insulating film 6, etc.

From the viewpoint of the performance of the gate insulating film and simplification of the manufacturing process, the low resistance layer 5 is preferably made of a mixture of the nitride of Hf and the oxide of Hf (for example, mixture of HfN and HfO, hereinafter referred to as HfN—HfO) and the gate insulating film 6 is preferably made of the oxide of Hf (for example, $HfO_2$).

The gate insulating film 6 may be made of the oxide, metal silicate, etc. of Ti, Zr, Hf or Ta. Concretely, the gate insulating film 6 is made of $HfO_2$ or HfSiO for Hf, $ZrO_2$ or ZrSiO for Zr, $TiO_2$ or TiSiO for Ti, or $TaO_2$ or TaSiO for Ta.

It should be noted that the low resistance layer 5 is thinner than the gate insulating film 6 in their film thickness. This is because the low resistance layer 6 made of the above material has a high density and hence a reduced volume as compared with the gate insulating film 5.

Next, the second modification will be explained.

The second modification is to add a reaction promoting element in the fifth step described later to the low resistance layer 5 and the gate insulating film 6 in the above first modification.

This modification further reduces the resistivity of the low resistance layer 5, thereby permitting the extension resistance to be further reduced.

In this modification, where the low resistance layer 5 is made of the nitride, Al (aluminum) or B (boron) is added.

For convenience of explanation, an explanation will be given of the case where the low resistance layer 5 is made of HfN—HfO—Al and the gate insulating film 6 is made of $HfO_2$—Al. The absolute value of the free energy generated for the added Al for its nitriding is smaller than that for the metal Hf used for the low resistance layer 5. This, as described later, promotes the creation of HfN in forming the low resistance layer 5.

The addition of Al to the low resistance layer 5 is preferred since it extremely reduces the resistivity of the low resistance layer 5. The addition of B to the low resistance layer 5 is preferred since it greatly promotes the creation of HfN. This is because an absolute value of the free energy generated for B for nitriding is smaller than that for Al.

Additionally, where the added element is metal such as Al, it is preferably added by the quantity providing the molar concentration which is ⅓ or less of that of the metal used for the low resistance layer. This permits the insulating performance of the gate insulating film 6 to be kept.

Embodiment 2

An explanation will be given of the CMOSFET according to the second embodiment of this invention. For convenience of explanation, referring FIG. 1B, only differences from FIG. 1A will be explained.

Figure 1B:
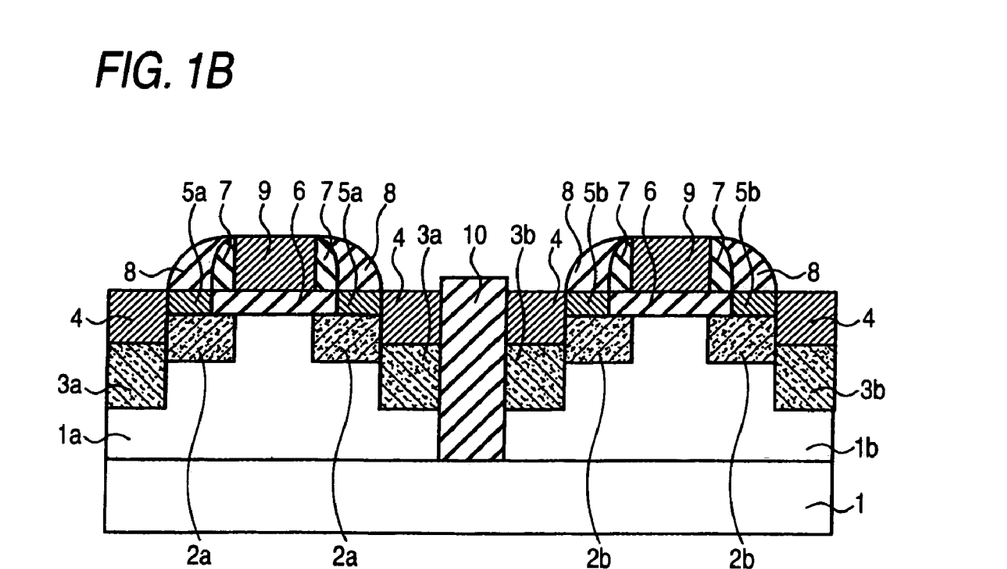
FIG. 1B is a sectional schematic view showing the CMOSFET according to the first embodiment of this invention.

FIG. 1B is a sectional schematic view in a gate length direction of the CMOSFET according to the second embodiment of this invention.

As seen from FIG. 1B, this CMOSFET is composed of two MOSFETs with different conduction types formed on the silicon substrate 1 as shown in FIG. 1A. Although not shown in FIG. 1B, the contact electrodes 4 of both MOSFETs are connected by wirings. Thus, both MOSFETs constitute a CMOSFET which operates complementarily with equal threshold voltages.

An explanation will be given of the materials for the low resistance layers which are preferred from the viewpoint of reducing the contact resistance due to the height of the Schottky barrier at the interfaces between p-type corresponding low resistance layers 5a and first p-type diffused layers 2a and between n-type corresponding low resistance layers 5b and first n-type diffused layers 2b.

As for the p-type corresponding low resistance layer 5a, the boride of Ti which has a work function of 5.1 to 5.4 eV is preferred. As for the n-type corresponding low resistance layer 5b, the carbide of Ti, Zr, Hf or Ta, the nitride of Zr or the boride of Hf or Zr which has a work function of 3.8 to 5.3 eV is preferred.

From the view point of simplifying the manufacturing process, the same material is preferably adopted for both p-type corresponding low resistance layer 5a and n-type corresponding low resistance layer 5b. In this case, the nitride of Ti or Hf is preferred because it has a small Schottky barrier height for both first p-type diffused layer 2a and first n-type diffused layer 2b, i.e. has a work function at a middle gap.

Embodiment 3

An explanation will be given of a method for manufacturing a MOSFET according to the third embodiment of this invention. For convenience of explanation, the explanation will be given of first to third MOSFETs according to the first modification of the first embodiment of this invention.

The first to third MOSFETs have a structure as shown in FIG. 1A. In the first to third MOSFETs, the gate insulating film 6 is made of the oxide of Ti, Zr, Hf or Ta. In the first MOSFET, the low resistance layer 5 is made of a mixture of the nitride and oxide of Ti, Zr, Hf or Ta. In the second MOSFET, the low resistance layer 5 is made of a mixture of the boride and oxide of Ti, Zr, Hf or Ta. In the third MOSFET, the low resistance layer 5 is made of the carbide and oxide of Ti, Zr, Hf or Ta.

Referring to FIGS. 2 to 7, an explanation will be given of a method for manufacturing the first MOSFET. In the first MOSFET, the low resistance layer 5 is made of a mixture of the nitride and oxide of Ti, Zr, Hf or Ta.

FIGS. 2 to 7 are sectional schematic views for explaining the first to sixth steps in the method for manufacturing the first MOSFET.

For convenience of explanation, an explanation will be given of the case where the low resistance layer 5 is made of HfN—HfO, the gate insulating film 6 is made of $HfO_2$, the gate electrode is made of poly-Si, the first gate side wall is made of $SiO_2$, the second gate side wall is made of SiN, and the contact electrode is made metal silicide.

Figure 2:
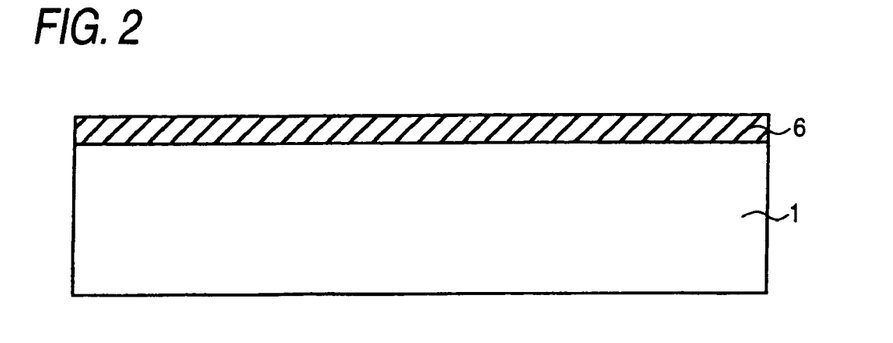
FIG. 2 is a sectional schematic view showing a first step in the method for manufacturing a first MOSFET according to a third embodiment of this invention.

As seen from FIG. 2, in a first step, the gate insulating film 6 ($HfO_2$) is deposited on the silicon substrate 1 by CVD (Chemical Vapor Deposition). In place of CVD, the deposition technique such as sputtering and MBE (Molecular Beam Epitaxy) may be adopted.

Figure 3:
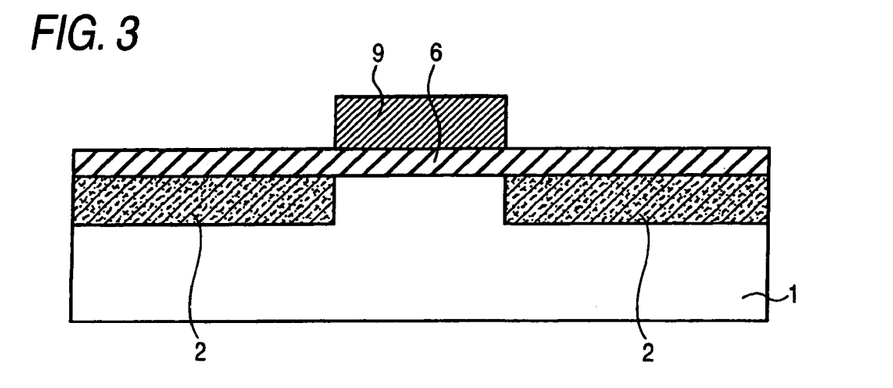
FIG. 3 is a sectional schematic view showing a second step in the method for manufacturing the first MOSFET according to the third embodiment of this invention.

As seen from FIG. 3, in a second step, the gate electrode 9 is formed through etching processing after deposition by CVD. Thereafter, impurities are introduced into the silicon substrate 1 by e.g. ion implantation to form the first diffused layers 2.

Figure 4:
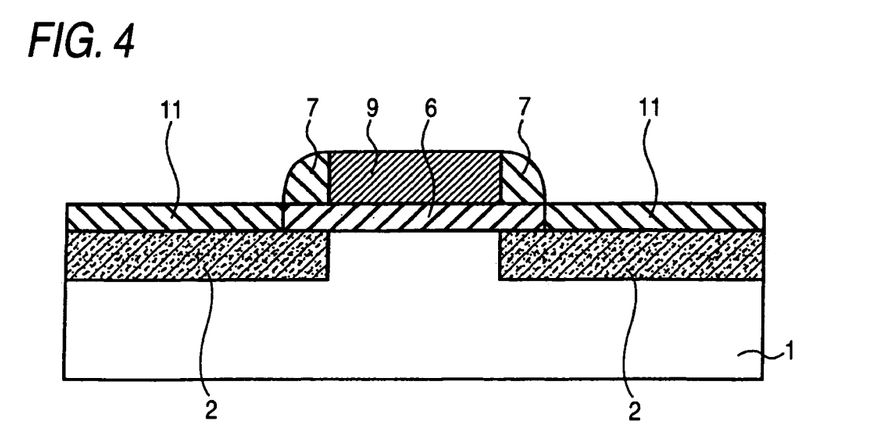
FIG. 4 is a sectional schematic view showing a third step in the method for manufacturing the first MOSFET according to the third embodiment of this invention.

As seen from FIG. 4, in a third step, after the first gate side walls 7 are formed, $HfO_2$ in an exposed portion of the gate insulating film 6 is supplied with nitrogen by plasma nitriding, thereby forming low resistance precursor layers 11. Thus, a part of the oxygen constituting $HfO_2$ is converted into nitrogen. Incidentally, the "plasma nitriding" refers to a nitrogen supplying technique using nitrogen in an excited state.

As for the nitrogen supplying technique, "plasma nitriding", "radical nitriding", etc. in which the area supplied with nitrogen is easily controlled are preferred. This is because it is desired to supply nitrogen to only the exposed portion of the gate insulating film 6. If the control of the area to be supplied with nitrogen is unsuccessful, in the MOSFET completed, the electric short-circuiting between the gate electrode 9 and the first diffused layer 2 may occur because the gate insulating film 6 beneath the first gate side wall 7 is also conductive. Other nitrogen supplying techniques are "thermal nitriding" by $NH_3$, NO, $N_2O$, etc. and N ion implantation.

If it is desired that HfN/HfO ratio is 1 in the material of the low resistance layer 5, nitrogen is preferably supplied by the quantity providing the concentration not lower than the Hf concentration in the low resistance precursor layer 11. The excess quantity of nitrogen is dispersed externally from the film as gas such as $N_2$ and NOx in the fifth step.

Figure 5:
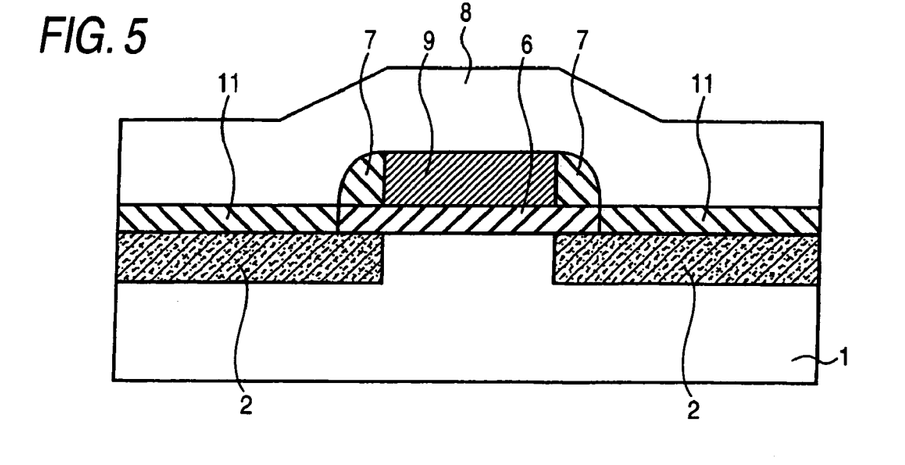
FIG. 5 is a sectional schematic view showing a fourth step in the method for manufacturing the first MOSFET according to the third embodiment of this invention.

As seen from FIG. 5, in a fourth step, a material constituting second gate side walls 8 (SiN) later is deposited to cover the structure made by the third step.

Figure 6:
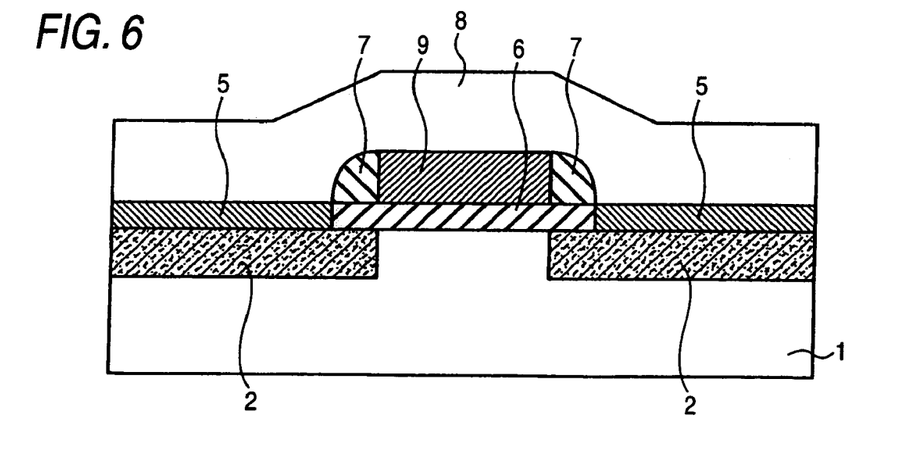
FIG. 6 is a sectional schematic view showing a fifth step in the method for manufacturing the first MOSFET according to the third embodiment of this invention.

As seen from FIG. 6, in a fifth step, by the heat treatment at a high temperature ranging from about 1000° C. to about 1200° C., the low resistance layers 5 (HfN—HfO) are formed. This is because HfN crystal grows during the high temperature heat treatment as a result of a reaction of supplied N with $HfO_2$.

Figure 7:
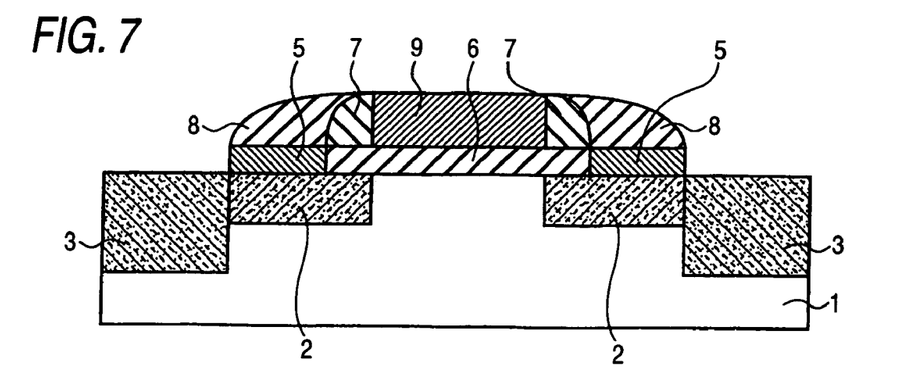
FIG. 7 is a sectional schematic view showing a sixth step in the method for manufacturing the first MOSFET according to the third embodiment of this invention.

As seen from FIG. 7, in a sixth step, by etching, the second gate side walls 8 are processed. Further, impurities are introduced through ion implantation. Thereafter, by heat treatment at about 1000° C., the second diffused layers 3 are formed.

Finally, by heat treating an evaporated metallic film, the contact electrodes 4 made of metal silicide are formed on the second diffused layers 3.

Through the steps described above, the first MOSFET is completed.

Figure 8:
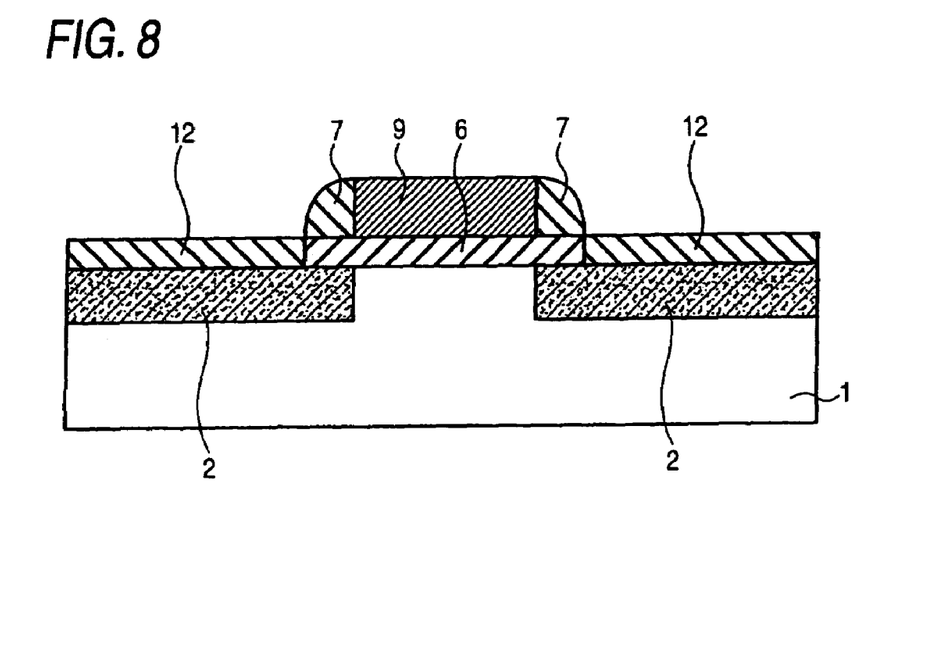
FIG. 8 is a sectional schematic view showing a third-first (3.1) step in the method for manufacturing a second MOSFET according to the third embodiment of this invention.
Figure 9:
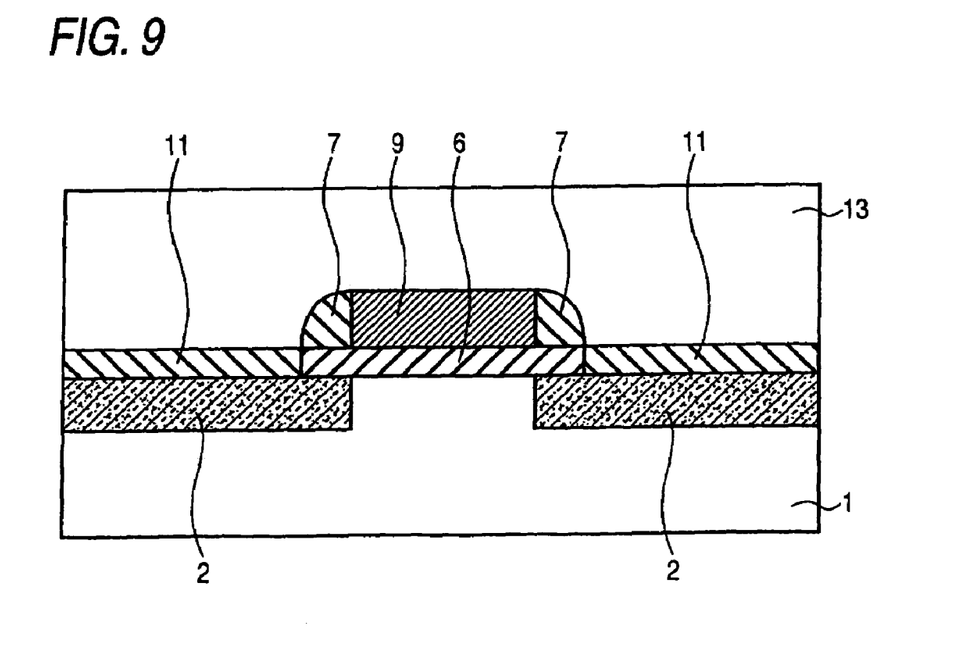
FIG. 9 is a sectional schematic view showing a third-second step in the method for manufacturing the second MOSFET according to the third embodiment of this invention.

Referring to FIGS. 8 and 9, an explanation will be given of the method for manufacturing the second MOSFET. In the second MOSFET, the low resistance layer 5 is made of a mixture of the boride and oxide of Ti, Zr, Hf or Ta.

For convenience of explanation, referring to the method for manufacturing the first MOSFET, the steps different therefrom, i.e. the third step and fifth step will be explained.

FIG. 8 is a sectional schematic view for explaining the third-first (3.1) step in the method for manufacturing the second MOSFET. FIG. 9 is a sectional schematic view for explaining the third-second (3.2) step in the method for manufacturing the second MOSFET.

As seen from FIG. 8, in the third-first (3.1) step in the method for manufacturing the second MOSFET, after the first gate side walls 7 are formed, an exposed portion of the gate insulating film 6 ($HfO_2$) is subjected to reduction treatment to form oxygen-deficient gate insulating films 12. The reduction treatment is carried out through e.g. hydrogen heat treatment at about 800° C. for about 10 minutes.

Next, as seen from FIG. 9, in the third-second (3.2) step, BSG (borosilicate glass) is deposited on the entire surface of the sample by a deposition technique and subjected to the heat treatment at a high temperature for a short time. During this step, boron atoms contained in the BSG 13 are diffused into the oxygen-deficient insulating films 12 so that the oxygen-deficient gate insulating films 12 are converted into the low resistance precursor layers 11. The high-temperature short-time heat treatment is carried out e.g. at about 900° C. for about 30 sec. In the method for manufacturing the second MQSFET, the boron supply to the gate insulating film is carried out through solid-phase diffusion from BSG, a uniform boron distribution with a high concentration can be realized.

Next, in the third-third (3.3) step, the BSG 13 is removed using dilute hydrofluoric acid solution, thereby forming the low resistance precursor layers 11 (oxygen-deficient insulating films supplied with boron at a high concentration) as shown in FIG. 4.

In the fifth step, the high temperature heat treatment is carried out to form the low resistance layers 5 (HfB—HfO). During this step, in the gate insulating film 6, Hf not combined with oxygen combines with boron.

An explanation will be given of the method for manufacturing the third MOSFET.

In the third MOSFET, the low resistance layer 5 is made of a mixture of the carbide and oxide of Ti, Zr, Hf or Ta.

For convenience of explanation, referring to the method for manufacturing the second MOSFET, the steps different therefrom, i.e. the third-first (3.1) step, third-second (3.2) step and fifth step will be explained.

In the third-second (3.2) step, using low-acceleration ion implantation and others, carbon is supplied to form the structure having the low resistance precursor layers 11 (oxygen-deficient insulating films supplied with boron at a high concentration) as shown in FIG. 4. For example, as a method of supplying carbon by the low acceleration ion implantation, carbon ions are implanted with acceleration energy of 1 keV and dose of $1 \times 10^{16}/cm^2$.

The method for manufacturing the third MOSFET does not have the step corresponding to the third-third (3.3) step in the method for manufacturing the second MOSFET.

In the fifth step, the high temperature heat treatment is carried out to form the low resistance layers 5 (HfC—HfO). During this step, in the gate insulating film 6, Hf not combined with oxygen combines with carbon.

A modification of the third embodiment will be explained below.

In this modification, referring to the method for manufacturing the MOSFET according to the second modification in the first embodiment, an explanation will be given of a step different from the third embodiment.

For convenience of explanation, referring to the method for manufacturing the first MOSFET, the explanation will be given of the case where the low resistance layer 5 is made of HfN—HfO—Al and the gate insulating film 6 is made of $HfO_2$—Al.

In the first step, the gate insulating film 6 made of Hf aluminate ($HfO_2$—Al) is formed. In the third step of forming the low resistance precursor layers 11, through nitriding, Al—N and $HfO_2$ partially nitrided are created. In the fifth step of forming the low resistance layers 5, Al—N supplies nitrogen to the $HfO_2$ partially nitrided to promote the creating reaction of the HfN—HfO, and Al—N itself transforms into Al pure metal. This is because Al has a smaller absolute value of the free energy generated for nitriding than that for Hf.

Incidentally, where the low resistance layer 5 is made of HfN—HfO—B and the gate insulating film 6 is made of $HfO_2$, in the third step, boron is added by e.g. ion implantation.

This modification is preferred since it promotes the creation of the low resistance layers 5 using a certain specific element.

As described above, the method for manufacturing the MOSFET according to the third embodiment of this invention has excellent consistency with the existing MOSFET manufacturing method.

EXAMPLE

An explanation will be given of an example of this invention and a comparative example.

As the example of this invention, the MOSFET corresponding to the 45 nm generation was manufactured by the method for manufacturing the first MOSFET. As for the comparative example, the MOSFET was manufactured by the same manufacturing method as in the example of this invention except the steps relative to forming the low resistance layers.

The low resistance layer 5 was formed of HfN—HfO to have a film thickness of 5 nm and a resistivity of $2 \times 10^{-5} \Omega \cdot cm$. The gate insulating film 6 was formed of $HfO_2$ to have a film thickness of 5 nm. The first diffused layers 2 were formed to have a film thickness of 25 nm and a resistivity of $10^{-4} \Omega \cdot cm$. The second diffused layers 3 were formed to have a film thickness of 100 nm and a resistivity of $10^{-4} \Omega \cdot cm$. As for the Y/X ratio, i.e. (layer width of the low resistance layer)/(horizontal width of the first gate side wall plus the second gate side wall), in the example of this invention, it is set at 0.5 whereas in the comparative example, it is set 0 (Y=0).

The resistance of each of these structures was calculated. In the comparative example, it was 40Ω, whereas in the example of this invention, it was 30Ω. This shows that the parasitic resistance can be reduced by 25% by design. A reduction in the parasitic resistance could be confirmed as an increase in the driving current for the MOSFET.

Figure 10:
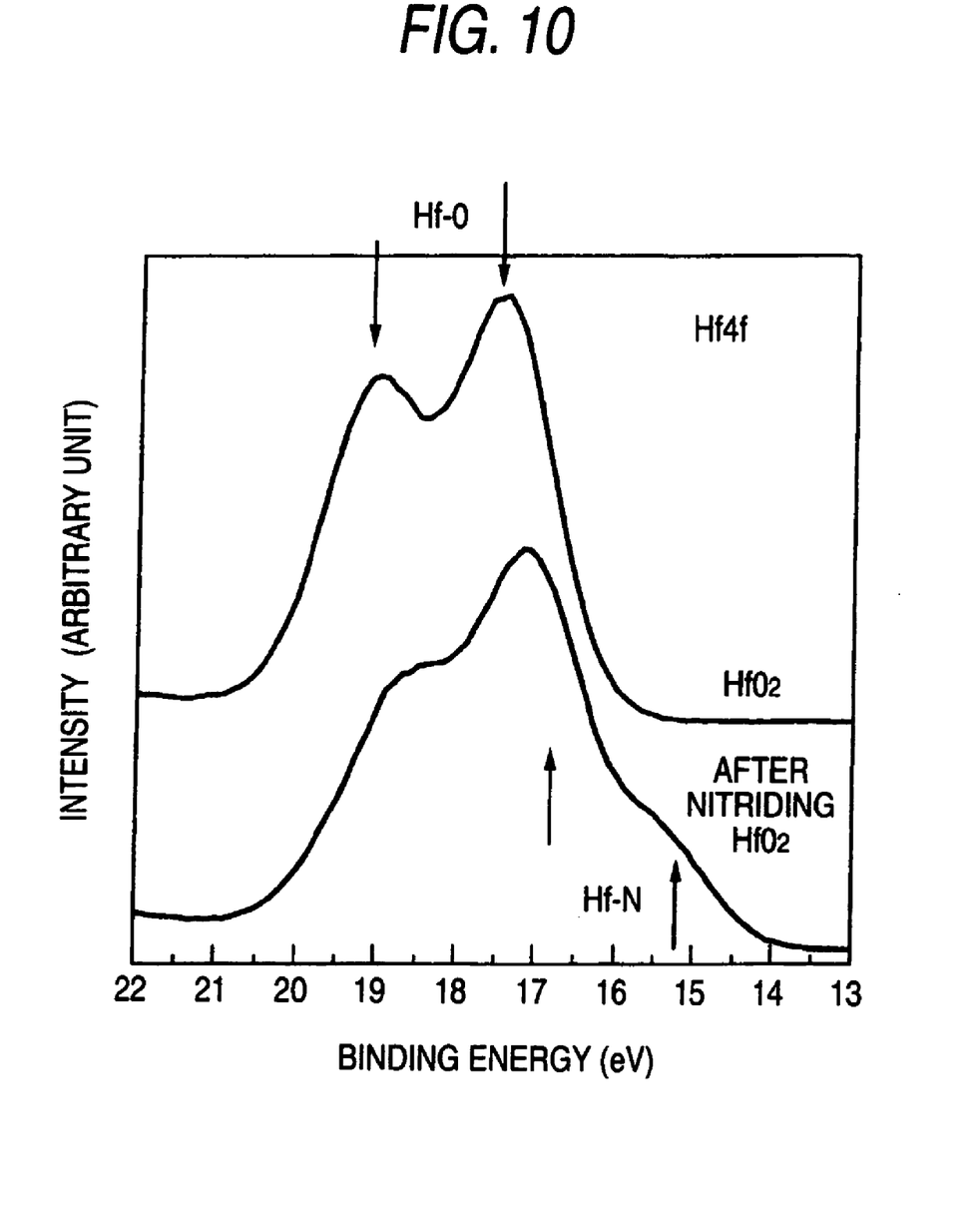
FIG. 10 is a graph showing an XPS—Hf4f spectrum in $HfO_2$ in the low resistance precursor layer 11 before and after the third step in the method for manufacturing the first MOSFET according to the third embodiment.
Figure 11:
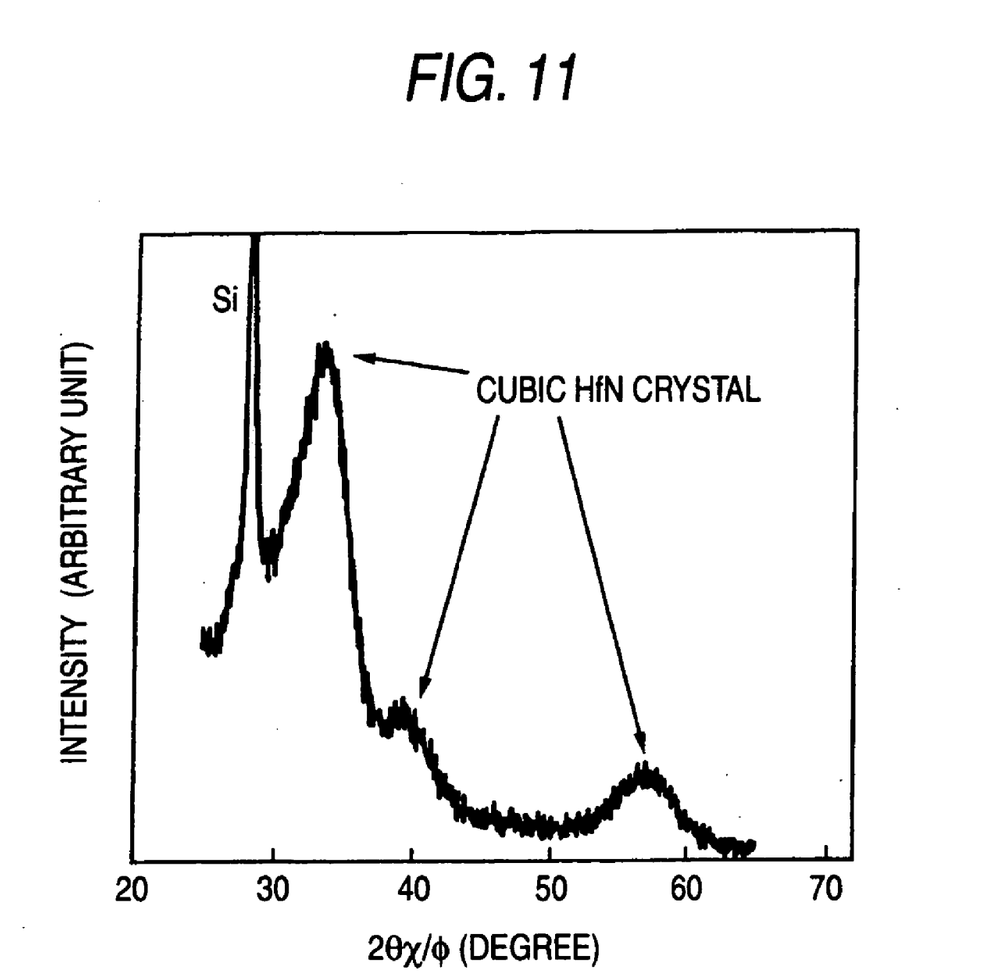
FIG. 11 is a graph showing the XRD measurement result of the HfN—HfO film corresponding to the low resistance layer 5 in the fifth step in the method for manufacturing the first MOSFET according to the third embodiment.
Figure 12:
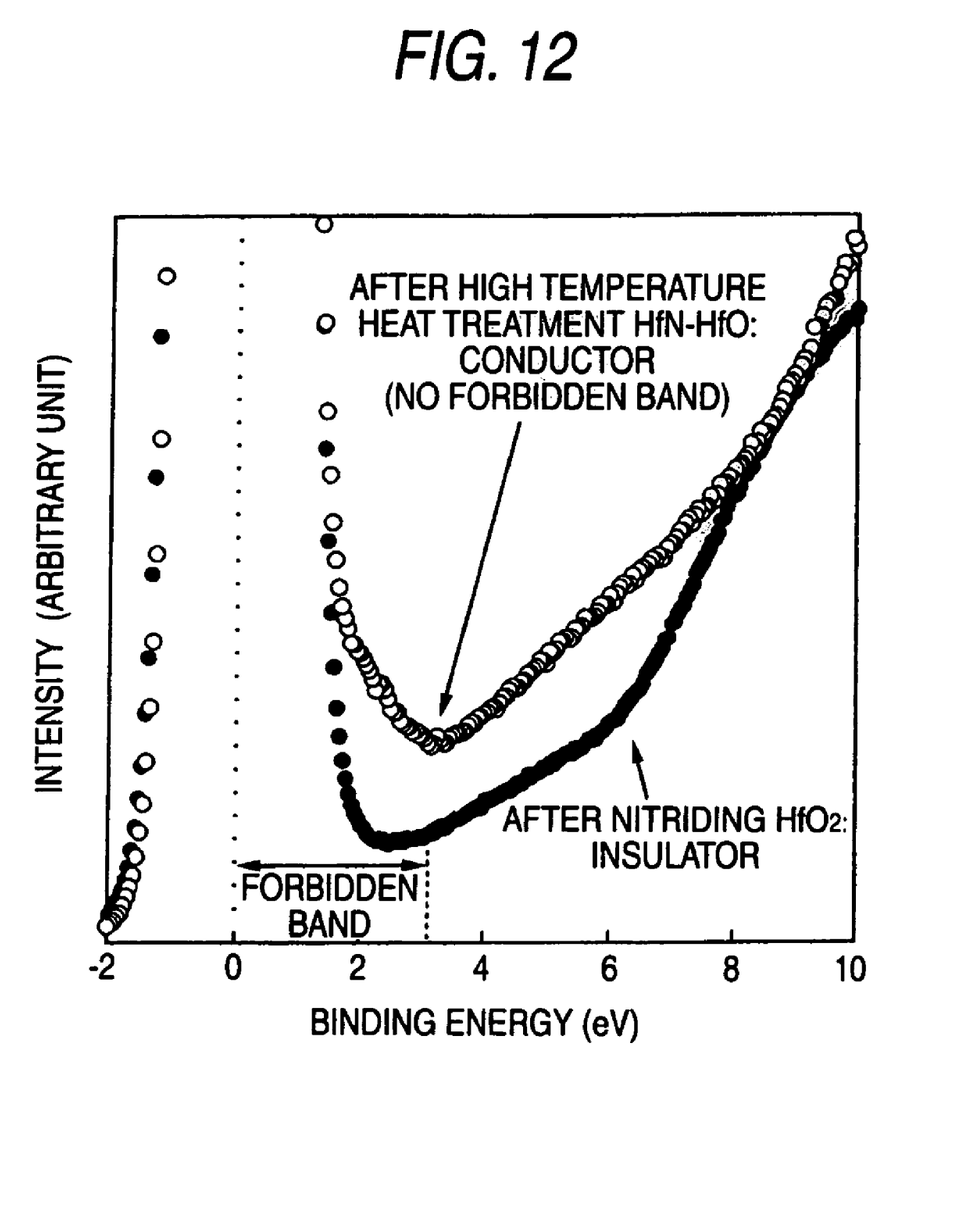
FIG. 12 is a graph showing an R-EELS spectrum of $HfO_2$ after the third step and HfN—HfO in the low resistance layer after the fifth step in the method for manufacturing the first MOSFET according to the third embodiment.

Referring to FIGS. 10 to 12, an explanation will be given of the data relative to the gate insulating film 6 (HfO$_2$), low resistance layer 5 (HfN—HfO) and low resistance precursor layer 11 (nitrided HfO$_2$) of the MOSFET.

FIG. 10 is a graph showing an XPS (X Ray photoelectron emission spectroscopy) —Hf4f spectrum exhibiting the element combining state of Hf in the gate insulating film 6 (HfO$_2$) and the low resistance precursor layer 11 (nitrided HfO$_2$) before and after plasma nitriding is performed in the third step. As regards the gate insulating film 6 (HfO$_2$), the peaks for only Hf—O are observed. As regards the low resistance precursor layer 11 (nitrided HfO$_2$), the peaks for Hf—N as well as those for Hf—O are observed.

FIG. 10 reveals that nitrogen substitutes for a part of oxygen in HfO$_2$ by plasma nitriding.

FIG. 11 shows the measurement result of XRD (X Ray Diffractometry) of the film corresponding to the low resistance layer 5 after the high temperature heat treatment in the fifth step. Incidentally, the measurement result illustrated in FIG. 11 does not relate to the low resistance layer 5 itself of the MOSFET, but relates to a continuous film for physical observation subjected to the corresponding processing. From FIG. 11, the crystallinity of the HfN—HfO film can be seen. As seen from FIG. 11, three peaks for cubic HFN crystal and the peak for Si were observed, but no peak for HfO$_2$ was observed.

Further, after the fifth step, with the section exposed, the low resistance layer 5 (HfN—HfO) was subjected to a local electron diffraction experiment using accelerated electron beams. As a result of experiment, the peak for the cubic HfN crystal was observed. Incidentally, also after the MOSFET has been completed, using the same technique, the creation of the cubic HfN crystal can be confirmed.

From the fact described above, it was confirmed that by heat-treating the nitrided HfO$_2$, HfO$_2$ reacts with nitrogen so that it is converted into HfN—HfO.

FIG. 12 is a graph showing an R-EELS (Reflection-Electron Energy Loss Spectoscopy) spectrum of the low resistance precursor layer 11 (nitrided HfO$_2$) after plasma nitriding in the third step and the low resistance layer (HfN—HfO) after the high temperature heat treatment in the fifth step. It can be seen from FIG. 12 that the low resistance layer precursor layer 11 (nitrided HfO$_2$) has a clear forbidden band to exhibit an insulating characteristic whereas the low resistance layer 5 (HfN—HfO) has no forbidden band to exhibit a conducting characteristic.

It could be confirmed from FIG. 12 that by the high temperature heat treatment, the nitrided HfO$_2$ exhibiting the insulating characteristic is converted into the HfN—HfO exhibiting the conducting characteristic.

This invention should not be limited to the various embodiments explained hitherto, but can be modified in various manners without departing from the spirit of the invention defined in claims. Further, in the stage of carrying out the invention, this invention can be modified in various manners.

What is claimed is:

1. A semiconductor device comprising:
a silicon substrate;
a channel region formed in a surface of the silicon substrate;
a gate insulating film formed on the channel region;
a gate electrode formed on the gate insulating film;
first gate side walls formed on the gate insulating film to sandwich the gate electrode in a gate length direction;
second gate side walls which sandwich the gate electrode and the first gate side wall;
first diffused layers formed on the surface of the silicon substrate to sandwich the channel region;
second diffused layers which sandwich the channel region and the first diffused layer and have a larger depth than that of the first diffused layer; and
low resistance layers which are formed between the first diffused layer and the second gate side wall and contain nitride, boride or carbide of Ti, Zr, Hf or Ta.

2. The semiconductor device according to claim 1, wherein the low resistance layers contain nitride or boride of Ti, Zr or Hf, or carbide of Ta.

3. The semiconductor device according to claim 2, wherein the low resistance layers contain nitride of Hf.

4. The semiconductor device according to claim 1, wherein the low resistance layers include a mixture of the nitride, boride or carbide of Ti, Zr, Hf or Ta and oxide thereof,
the gate insulating film includes the oxide of Ti, Zr, Hf or Ta, and
the low resistance layer and the gate insulating film have equal molar concentrations of each atom of Ti, Zr, Hf or Ta.

5. The semiconductor device according to claim 2,
wherein the low resistance layers include a mixture of the nitride, boride or carbide of Ti, Zr, Hf or Ta and oxide thereof,
the gate insulating film includes the oxide of Ti, Zr, Hf or Ta, and
the low resistance layer and the gate insulating film have equal molar concentrations of each atom of Ti, Zr, Hf or Ta.

6. The semiconductor device according to claim 3,
wherein the low resistance layers include a mixture of the nitride, boride or carbide of Ti, Zr, Hf or Ta and oxide thereof,
the gate insulating film includes the oxide of Ti, Zr, Hf or Ta, and
the low resistance layer and the gate insulating film have equal molar concentrations of each atom of Ti, Zr, Hf or Ta.

7. The semiconductor device according to claim 1,
wherein the low resistance layers contain Al atoms at a molar concentration that is equal to or less than ⅓ of that of Ti, Zr, Hf or Ta atom.

8. The semiconductor device according to claim 2,
wherein the low resistance layers contain Al atoms at a molar concentration that is equal to or less than ⅓ of that of Ti, Zr, Hf or Ta atom.

9. The semiconductor device according to claim 3,
wherein the low resistance layers contain Al atoms at a molar concentration that is equal to or less than ⅓ of that of Ti, Zr, Hf or Ta atom.

10. The semiconductor device according to claim 4,
wherein the low resistance layers contain Al atoms at a molar concentration that is equal to or less than ⅓ of that of Ti, Zr, Hf or Ta atom.

11. The semiconductor device according to claim 5, wherein the low resistance layers contain Al atoms at a molar concentration that is equal to or less than ⅓ of that of Ti, Zr, Hf or Ta atom.

12. The semiconductor device according to claim 6, wherein the low resistance layers contain Al atoms at a molar concentration that is equal to or less than ⅓ of that of Ti, Zr, Hf or Ta atom.

13. A complementary semiconductor device comprising:

a silicon substrate;

a p-type semiconductor field-effect transistor; and an n-type semiconductor field-effect transistor, wherein the p-type semiconductor field-effect transistor includes:

an n-type channel region formed in a surface of the silicon substrate;

a first gate insulating film formed on the n-type channel region;

a first gate electrode formed on the first gate insulating film;

first gate side walls formed on the first gate insulating film to sandwich the first gate electrode in a gate length direction;

second gate side walls which sandwich the first gate electrode and the first gate side wall;

first p-type diffused layers formed on the surface of the silicon substrate to sandwich the n-type channel region;

second p-type diffused layers which sandwich the n-type channel region and the first p-type diffused layer and have a larger depth than that of the first p-type diffused layer; and p-type corresponding low resistance layers which are formed between the first p-type diffused layer and the second gate side wall and contain boride of Ti, and the n-type semiconductor field-effect transistor includes:

a p-type channel region formed in the surface of the silicon substrate;

a second gate insulating film formed on the p-type channel region;

a second gate electrode formed on the second gate insulating film;

third gate side walls formed on the second gate insulating film to sandwich the second gate electrode in a gate length direction;

fourth gate side walls which sandwich the second gate electrode and the third gate side wall;

first n-type diffused layers formed on the surface of the silicon substrate to sandwich the p-type channel region;

second n-type diffused layers which sandwich the p-type channel region and the first n-type diffused layer and have a larger depth than that of the first n-type diffused layer; and n-type corresponding low resistance layers which are formed between the first n-type diffused layer and the fourth gate side wall and contain carbide of Ti, Zr, Hf or Ta, nitride of Zr, or boride of Hf or Zr.

* * * * *